United States Patent [19]

Kawamura

[11] Patent Number: 5,488,008
[45] Date of Patent: Jan. 30, 1996

[54] METHOD OF FABRICATING A STACKED CAPACITOR MEMORY CELL IN A SEMICONDUCTOR MEMORY DEVICE

[75] Inventor: Koichiro Kawamura, Tokyo, Japan

[73] Assignee: Nippon Steel Corporation, Tokyo, Japan

[21] Appl. No.: 384,465

[22] Filed: Feb. 2, 1995

Related U.S. Application Data

[63] Continuation of Ser. No. 131,609, Oct. 5, 1993, abandoned.

[30] Foreign Application Priority Data

Oct. 9, 1992 [JP] Japan ............................ 4-297702

[51] Int. Cl.⁶ .................... H01L 21/70; H01L 27/00
[52] U.S. Cl. ................. 437/52; 437/60; 437/919; 437/977
[58] Field of Search ............ 437/977, 60; 148/DIG. 138

[56] References Cited

U.S. PATENT DOCUMENTS 5,134,086  7/1992  Ahn .................................. 437/52
5,164,881  11/1992  Ahn .................................. 437/52

OTHER PUBLICATIONS

Wolf et al. Silicon Processing for the VLSI ERA vol. 1, Process Technology, pp. 181–182, 264–266, 556–558.
Silicon Processing for the VLSI ERA, vol. 1 Process Technology, Wolf, pp. 551–557, Lattice press.

Rugged Surface Poly–Si Electrode And Low Temperature Deposited $Si_3N_4$ For 64MBIT And Beyond STC Dram Cell IEDM (1990) pp. 659–662.

Primary Examiner—Olik Chaudhuri
Assistant Examiner—H. Jey Tsai
Attorney, Agent, or Firm—Pollock, Vande Sande & Priddy

[57] ABSTRACT

A method of manufacturing a capacitor, in a semiconductor memory device having memory cells, each including a transistor and a capacitor includes steps of depositing an insulating film on a semiconductor substrate and forming a polycrystalline silicon film serving as a lower electrode of the capacitor on the insulating film. An oxide film having an uneven surface is deposited on the polycrystalline silicon film by exposing the polycrystalline silicon film to an oxidizing atmosphere including N-type impurities. The polycrystalline silicon film and the oxide film are anisotropically etched until the oxide film is substantially completely removed. The uneven surface of the oxide layer produces an uneven etch rate of the polycrystalline silicon film and a magnification of the uneven surface of the oxide film in the polycrystalline silicon film.

4 Claims, 2 Drawing Sheets

METHOD OF FABRICATING A STACKED CAPACITOR MEMORY CELL IN A SEMICONDUCTOR MEMORY DEVICE

This application is a continuation of U.S. Ser. No. 08/131,609 filed on Oct. 5, 1993, now abandoned.

FIELD OF THE INVENTION

The present invention relates to a method of fabricating a semiconductor memory device, which is suitable specifically for application to fabrication of DRAM memory cells.

BACKGROUND OF THE INVENTION

In a DRAM principally used heretofore, a memory cell includes an MOS transistor and a capacitive element (capacitor) and write or read of information in or from the memory cell is effected by storing or detecting electric charge in the capacitor by switching operation of the MOS transistor.

A stacked capacitor, in which a second electrode (upper electrode) is formed so as to be superposed on a first electrode (lower electrode) with a dielectric film interposed between them, is usually used for this capacitor.

However, in DRAM memory cells having stacked capacitors thus constructed, it has become difficult to obtain a desired storage capacitance of the capacitor because of a decreased space applicable to the stacked capacitor in each cell with increasing integration density and fineness of the semiconductor memory device.

Therefore it is important to increase the storage capacitance of the capacitor formed in a restricted space. In order to solve this problem, a method has been proposed to increase the storage capacitance of the capacitor, in which an effective capacitor area is increased by forming fine projections on the upper surface of the lower electrode acting as a storage node, as disclosed in International Electron Devices Meeting IEDM (1990) pp 659–662.

By this method, an amorphous silicon thin film is deposited while controlling temperature and pressure for forming the thin film at depositing the silicon thin film serving as the lower electrode on a substrate by the CVD method to form the fine projections on the upper surface of this thin film.

However, in the case where the lower electrode of the stacked capacitor is formed by using the method described above, since fine projections formed on the upper surface of the thin film are reduced in size when the thickness of the thin film is increased to about 0.2 µm, which is a practical thickness, it is necessary to form the thin film of a desired thickness by repeating the process for forming a film of a smaller thickness several times. Further, since the magnitude of the fine projections depends sometimes on the temperature at the formation of the thin film, precise temperature control within ±5° C. is required. For this reason and others, in the method described above control of the thin film forming process is complicated and difficult.

SUMMARY OF THE INVENTION

The object of the present invention is to provide a method of fabricating a semiconductor memory device, by which it is possible to increase the effective surface area of the lower electrode thereby to increase the storage capacitor by forming fine projections on the upper surface of the lower electrode of the capacitor in a DRAM memory cell with a good controllability and in a simple manner.

In order to achieve the above object, the present invention method of fabricating a capacitor in a semiconductor memory device having memory cells, each of which includes a transistor and a capacitor, comprises a first step of forming a polycrystalline silicon film serving as a lower electrode of the capacitor, on a semiconductor substrate with an insulating film interposed between them; a second step of introducing N type impurities into the polycrystalline silicon film in an oxidizing atmosphere; and a third step of etching anisotropically the polycrystalline silicon film, into which the N type impurities are introduced.

According to the present invention, when the N type impurities are introduced into the polycrystalline silicon film serving as the lower electrode, an oxide film having uneven thickness formed on the surface of the polycrystalline silicon film is utilized as an impurity diffusion source. These oxide film and polycrystalline silicon film are simultaneously etched anisotropically, for example, by reactive ion etching and thus differences are produced in the etching rate for the polycrystalline silicon film between parts where the oxide film is thick and parts where it is thin. In this way, the uneven surface configuration of the oxide film having fine projections is transferred with magnified scale to the upper surface of the polycrystalline silicon film.

In this manner a lower electrode having a large effective surface area can be formed in a small real area.

DESCRIPTION OF THE PREFERRED EMBODIMENTS

At first, the construction of a DRAM memory cell fabricated by the method according to an embodiment of the present invention will be explained, referring to FIG. 6.

Figure 6:
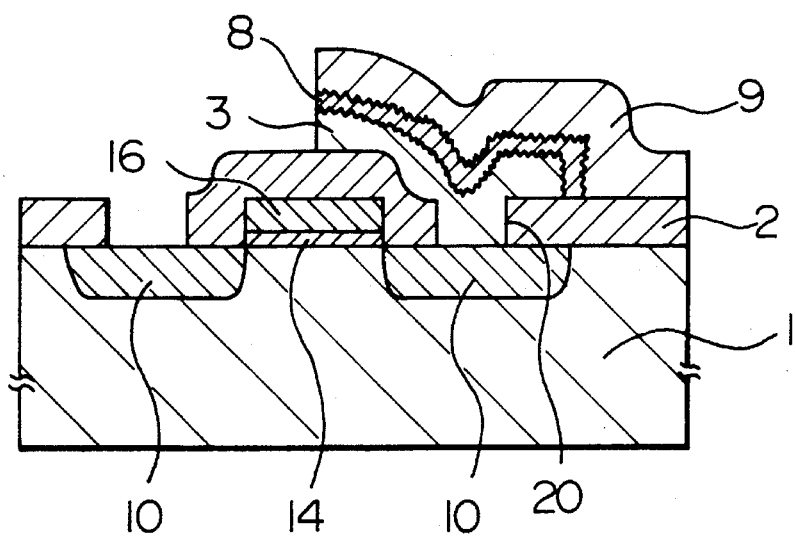
FIG. 6 is a cross-sectional view indicating the construction of a memory cell in a semiconductor memory device fabricated by the method according to the present invention.

As indicated in FIG. 6, a memory cell formed on a surface of a semiconductor substrate 1 includes a transistor having source and drain diffusion regions 10, 10, a gate insulating film 14 and a gate 16; and a capacitor having a lower electrode 3, a capacitor insulating film 8 and an upper electrode 9. The lower electrode 3 is connected electrically with one of the source and drain regions 10, 10 through a contact hole 20. Many fine projections are formed on the upper surface of the lower electrode 3, as described later.

Next, the most important steps of the method according to the present invention, which relate to the formation of the lower electrode, will be explained referring to FIGS. 1 to 5. In order to simplify the figures, FIGS. 1 to 5 indicate only the parts relating directly to the formation of the lower electrode in an enlarged scale, omitting the parts, which do not relate to the formation of the lower electrode, among the various parts indicated in FIG. 6, that is the source and drain diffusion regions 10, 10, the gate insulating film 14, the gate 16, and the contact hole 20.

Figure 1:
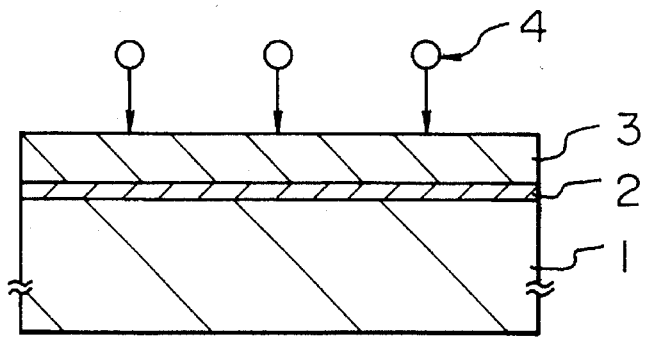
FIG. 1 is a cross-sectional view for explaining a first step in an embodiment of the method for fabricating a semiconductor memory device according to the present invention.

At first, as indicated in FIG. 1, an $SiO_2$ film 2, which is an insulating film, is formed on a surface of a P or N conductivity type silicon substrate 1 by thermal oxidation method. Thereafter a polycrystalline silicon thin film 3 having a thickness of about 0.4 μm is formed on the whole surface, for example, by CVD method.

Figure 2:
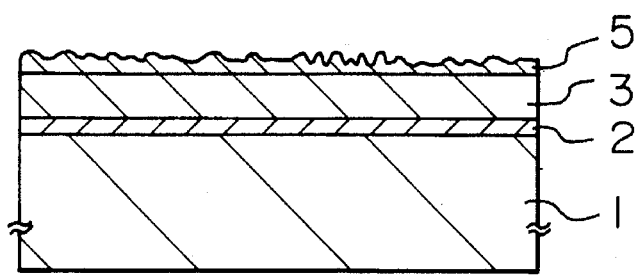
FIG. 2 is a cross-sectional view for explaining a second step in the embodiment.

Next, an oxide phosphorus glass film 4 is deposited in an oxidizing atmosphere on the surface of the polycrystalline silicon thin film 3 by using phosphonyl chloride $POCl_3$ 4, as a source, as indicated in FIG. 2. Phosphorus is thermally diffused from this phosphorus glass film 5 into the polycrystalline silicon thin film 3. Since phosphorus is diffused along the non-uniform grain boundary of the polycrystalline silicon, phosphorus concentration in the polycrystalline silicon thin film 3 is non-uniform and further, as indicated in FIG. 2, there exist fine projections on the surface of the phosphorus glass film 5 formed on the surface thereof. In the present embodiment, the thin film is doped with phosphorus so that the sheet resistance thereof is reduced to about 30 $\Omega/cm^2$. The thickness of the phosphorus glass film 5 is about 30 to 50 nm.

Figure 3:
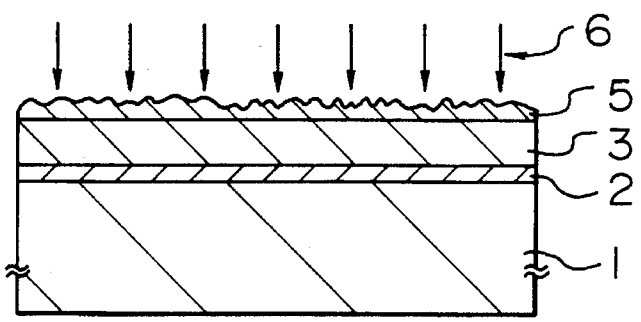
FIG. 3 is a cross-sectional view for explaining a third step in the embodiment.

Next, as indicated in FIG. 3, the polycrystalline silicon thin film 3 is etched in the depth direction by about 0.2 μm by reactive ion etching 6, by which reactive positive ions are introduced vertically into the polycrystalline thin film 3, utilizing the phosphorus glass film 5 formed on the surface thereof as an etching mask. In this reactive ion etching 6, the lateral etching amount, so-called side etching amount, is kept so as to be smaller than 0.1 μm and the ratio of the etching rate of the polycrystalline silicon thin film 3 to that of the phosphorus glass film 5 is made greater than 3.

Figure 4:
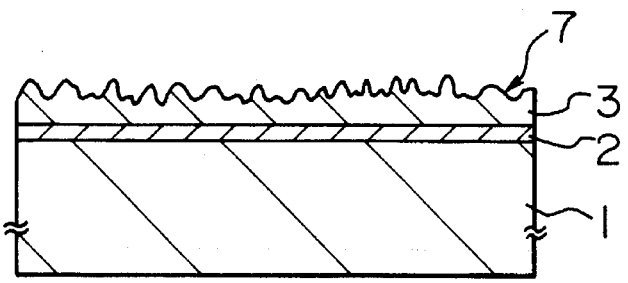
FIG. 4 is a cross-sectional view for explaining a fourth step in the embodiment.

In this way, since the parts where the phosphorus glass film 5 is thin are etched and removed earlier than the others, etching of the polycrystalline silicon thin film 3 begins there earlier and proceeds rapidly. In this way differences in etching rate of the polycrystalline silicon thin film 3 are produced between the parts where the thickness of the phosphorus glass is large and the parts where it is small. Therefore, level differences are produced between the parts where the phosphorus glass film 5 is removed and the parts where it remains and thus it is possible to form a pattern of fine projections 7 having a diameter of about 50 to 200 nm on the upper surface of the polycrystalline silicon thin film 3, which is substantially a magnified copy of the fine projection pattern of the phosphorus glass film 5, as indicated in FIG. 4. As the result, for example, the remaining film thickness in a part where the phosphorus glass film 5 is originally formed with 30 nm thick is about 0.29 μm, while the remaining film thickness in a part where the phosphorus glass film 5 is originally formed with 50 nm thickness is about 0.35 μm.

Figure 5:
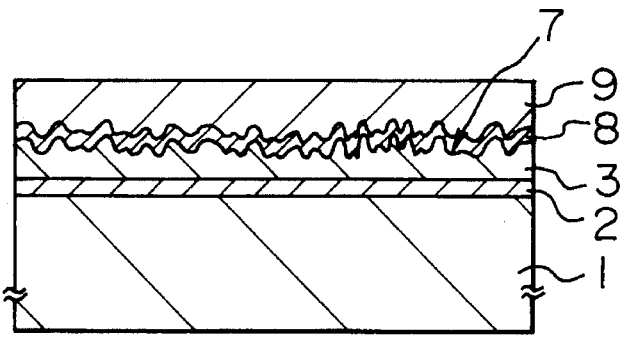
FIG. 5 is a cross-sectional view for explaining a fifth step in the embodiment.

Next, as indicated in FIG. 5, the polycrystalline silicon thin film 3 is patterned in a shape as shown in FIG. 6 to form the lower electrode 3 and then a dielectric film 8, which is, for example, a three-layered film (ONO film) of a silicon oxide ($SiO_2$) film, a silicon nitride ($Si_3N_4$) film and another $SiO_2$ film, is formed on this lower electrode 3. A stacked capacitor is completed by forming an upper electrode 9, which is, for example, a polycrystalline silicon film, on the dielectric film 8. Fine projections corresponding to those of the upper surface of the lower electrode 3 are produced on the upper surface of the dielectric film 8 and accordingly on the lower surface of the upper electrode 9.

According to the present embodiment, it is possible to form fine projections 7 on the upper surface of the lower electrode 3 with a good controllability and in a simple manner by utilizing an unevenly thick phosphorus glass film 5, which is formed at a process of doping the polycrystalline silicon thin film 3 with phosphorus in order to reduce the resistance of the polycrystalline silicon thin film 3 serving as the lower electrode and applying reactive ion etching to the polycrystalline silicon thin film 3.

Although the present invention has been explained with respect to one embodiment thereof, the present invention is not restricted to the embodiment described above.

For example, although phosphorus is used as dopant for the polycrystalline silicon thin film 3 in the embodiment described above, arsenic may be used therefor. In this case, $As^+$ ion is ion-implanted at a dose of about $5\times10^{13}$ $cm^{-2}$ by using As gas or $AsH_3$ gas, as a source. Further it may be possible to vary the thickness of the oxide film formed on the surface of the polycrystalline silicon thin film 3 by varying the dose of the dopant and thus to vary the diameter of the fine projections 7 on the surface of the polycrystalline silicon thin film 3.

Further, although, in the embodiment described above, patterning is effected after forming the fine projections 7 on the surface of the polycrystalline silicon thin film 3, the patterning may be effected before doping the polycrystalline silicon thin film 3 with impurities.

As explained above, according to the present invention, it is possible to form fine projections on the surface of the lower electrode to increase the effective surface area of the capacitor with a good controllability and in a simple manner by effecting anisotropic etching such as reactive ion etching, utilizing an oxide film formed at doping the polycrystalline silicon thin film with N type impurities, for example, phosphorus, arsenic, and the like, which is usually carried out in order to reduce resistivity.

I claim:

1. A method of manufacturing a capacitor, in a semiconductor memory device having memory cells, each having a transistor and a capacitor, comprising the steps of:

depositing an insulating film on a semiconductor substrate;

forming on said insulating film a polycrystalline silicon film serving as a lower electrode of said capacitor;

depositing an oxide film having an uneven surface on said polycrystalline silicon film by exposing said polycrystalline silicon film to an oxidizing atmosphere including N-type impurities; and etching anisotropically said polycrystalline silicon film and said oxide film until said oxide film is substantially completely removed, said uneven surface of said oxide layer producing an uneven etch rate of said polycrystalline silicon film and a magnification of said uneven surface of said oxide film in said polycrystalline silicon film.

2. A method according to claim 1, wherein said anisotropical etching is reactive ion etching.

3. A method according to claim 2, wherein lateral etching amount of said polycrystalline silicon thin film in said reactive ion etching is smaller than 0.1 μm.

4. A method according to claim 3, wherein a ratio of said etching rate of said polycrystalline silicon thin film to that of said oxide film is greater than 3.

* * * * *